(12) United States Patent
Sathyamurthy et al.

(10) Patent No.: US 11,692,776 B2
(45) Date of Patent: Jul. 4, 2023

(54) MOUNTING AND USE OF PIEZOELECTRIC COOLING SYSTEMS IN DEVICES

(71) Applicant: Frore Systems Inc., San Jose, CA (US)

(72) Inventors: Prabhu Sathyamurthy, San Jose, CA (US); Suryaprakash Ganti, Los Altos, CA (US); Seshagiri Rao Madhavapeddy, La Jolla, CA (US); Lumaya Ahmed, Sunnyvale, CA (US); Shekhar Halakatti, Campbell, CA (US)

(73) Assignee: Frore Systems Inc., San Jose, CA (US)

(*) Notice: Subject to any disclaimer, the term of this patent is extended or adjusted under 35 U.S.C. 154(b) by 0 days.

(21) Appl. No.: 17/683,020

(22) Filed: Feb. 28, 2022

(65) Prior Publication Data

US 2022/0282932 A1    Sep. 8, 2022

Related U.S. Application Data

(60) Provisional application No. 63/155,721, filed on Mar. 2, 2021, provisional application No. 63/220,371, filed on Jul. 9, 2021.

(51) Int. Cl.
*F28D 9/00* (2006.01)
*H01L 41/09* (2006.01)
*H10N 30/20* (2023.01)

(52) U.S. Cl.
CPC ....... *F28D 9/0081* (2013.01); *H10N 30/2042* (2023.02)

(58) Field of Classification Search
CPC .............. F28F 13/10; F28F 2250/08; F28D 2021/0028; H01L 23/467; H01L 41/094; H01L 23/4735; H05K 7/20; H05K 7/20136; H05K 7/20154; H05K 7/20863; H05K 7/20909; H05K 7/20972; F04B 17/003; F04B 43/046; F04B 43/095
See application file for complete search history.

(56) References Cited

U.S. PATENT DOCUMENTS

| | | | |
|---|---|---|---|
| 6,650,542 B1* | 11/2003 | Chrysler | H01L 23/4735 174/15.1 |
| 8,678,787 B2* | 3/2014 | Hirata | F04B 43/046 417/413.1 |
| 10,085,363 B2* | 9/2018 | Refai-Ahmed | H05K 7/20263 |
| 10,285,307 B2* | 5/2019 | Chen | H05K 7/20172 |
| 10,314,198 B2* | 6/2019 | Chen | H05K 7/20209 |
| 10,788,034 B2* | 9/2020 | Ganti | B06B 1/06 |
| 10,943,850 B2* | 3/2021 | Ganti | F04B 53/08 |

(Continued)

OTHER PUBLICATIONS

Bergquist Selection Guide Thermal Interface Materials, Henkel Corp., 2019, p. 6, 8, and 13. (Year: 2019).*

*Primary Examiner* — Tho V Duong
(74) *Attorney, Agent, or Firm* — Van Pelt, Yi & James LLP

(57) ABSTRACT

A cooling system including a heat spreader, an active cooling element, and a base is described. The heat spreader is in thermal communication with a heat-generating structure mounted on a substrate. The heat spreader over hangs the heat-generating structure. The active cooling element is in thermal communication with the heat spreader. The base supports the heat spreader and transfers a load from the heat spreader to the substrate such that a bending of the heat spreader does not exceed ten degrees.

17 Claims, 11 Drawing Sheets

(56) References Cited

U.S. PATENT DOCUMENTS

| | | |
|---|---|---|
| 11,043,444 B2* | 6/2021 | Ganti ................... F04D 33/00 |
| 2004/0182088 A1 | 9/2004 | Ghoshal |
| 2004/0188066 A1* | 9/2004 | Upadhya ................. F28F 3/02 |
| | | 257/E23.098 |
| 2005/0074662 A1* | 4/2005 | Cho ...................... G06F 1/20 |
| | | 429/444 |
| 2005/0089415 A1* | 4/2005 | Cho ..................... F04B 45/047 |
| | | 417/413.1 |
| 2006/0147324 A1* | 7/2006 | Tanner ................ F04B 43/046 |
| | | 417/411 |
| 2009/0086416 A1* | 4/2009 | Ishikawa ........... H05K 7/20172 |
| | | 361/679.01 |
| 2009/0148320 A1* | 6/2009 | Lucas .................. F04B 43/046 |
| | | 417/481 |
| 2009/0232682 A1* | 9/2009 | Hirata ................. F04B 43/046 |
| | | 417/413.2 |
| 2009/0232683 A1* | 9/2009 | Hirata ................. F04B 45/047 |
| | | 417/413.2 |
| 2010/0051242 A1* | 3/2010 | Arik .................. B05B 17/0607 |
| | | 165/104.33 |
| 2010/0074775 A1* | 3/2010 | Yamamoto ........... F04B 43/046 |
| | | 417/413.2 |
| 2011/0157827 A1* | 6/2011 | Chao ................... H01L 23/427 |
| | | 361/699 |
| 2011/0259557 A1* | 10/2011 | Chao ................... F04B 43/046 |
| | | 417/413.1 |
| 2012/0085949 A1* | 4/2012 | Chen .................. F04B 43/043 |
| | | 251/129.01 |
| 2012/0171062 A1* | 7/2012 | Kodama ............. F04B 43/046 |
| | | 417/413.2 |
| 2013/0071269 A1* | 3/2013 | Fujisaki ............... F04B 43/046 |
| | | 417/413.2 |
| 2014/0240993 A1* | 8/2014 | Seeley ................... F21V 29/63 |
| | | 362/382 |
| 2015/0028966 A1 | 1/2015 | Iwamoto |
| 2015/0071797 A1* | 3/2015 | Takeuchi ........... F04B 43/0054 |
| | | 417/413.2 |
| 2015/0342088 A1* | 11/2015 | Refai-Ahmed ......... B23P 15/26 |
| | | 165/104.31 |
| 2016/0076530 A1* | 3/2016 | Chen ................... F04B 45/047 |
| | | 417/413.2 |
| 2016/0090978 A1* | 3/2016 | Kim ..................... F04B 43/046 |
| | | 165/104.34 |
| 2016/0095255 A1* | 3/2016 | Cheng ............... H05K 7/20172 |
| | | 165/83 |
| 2016/0358841 A1* | 12/2016 | Eid ....................... H01L 23/467 |
| 2017/0222123 A1* | 8/2017 | Chen ................... F16K 99/0048 |
| 2017/0222125 A1* | 8/2017 | Chen ................... F16K 99/0015 |
| 2017/0292537 A1* | 10/2017 | Barak ................ H05K 7/20172 |
| 2018/0087846 A1* | 3/2018 | Remsburg ........... H01L 21/4882 |
| 2018/0146573 A1* | 5/2018 | Chen .................... H01L 41/053 |
| 2018/0146574 A1* | 5/2018 | Chen ................. H05K 7/20145 |
| 2019/0101938 A1* | 4/2019 | Mou ................... G05D 7/0694 |
| 2019/0206839 A1* | 7/2019 | Balakrishnan ........ H01L 23/367 |
| 2019/0247880 A1* | 8/2019 | Mou ................... F04B 45/047 |
| 2020/0049386 A1* | 2/2020 | Ganti ................... B06B 1/0622 |
| 2020/0051895 A1* | 2/2020 | Ganti ................... B06B 1/0622 |
| 2020/0053905 A1* | 2/2020 | Ganti ................. H01L 23/4735 |
| 2020/0088185 A1* | 3/2020 | Mou ................... H01L 41/0973 |
| 2020/0229320 A1* | 7/2020 | Mou ................... A41D 13/002 |
| 2020/0381339 A1 | 12/2020 | Ganti |
| 2021/0035886 A1 | 2/2021 | Islam |

* cited by examiner

MOUNTING AND USE OF PIEZOELECTRIC COOLING SYSTEMS IN DEVICES

CROSS REFERENCE TO OTHER APPLICATIONS

This application claims priority to U.S. Provisional Patent Application No. 63/155,721 entitled MOUNTING AND USE OF PIEZOELECTRIC COOLING SYSTEMS IN DEVICES filed Mar. 2, 2021 which is incorporated herein by reference for all purposes.

This application claims priority to U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
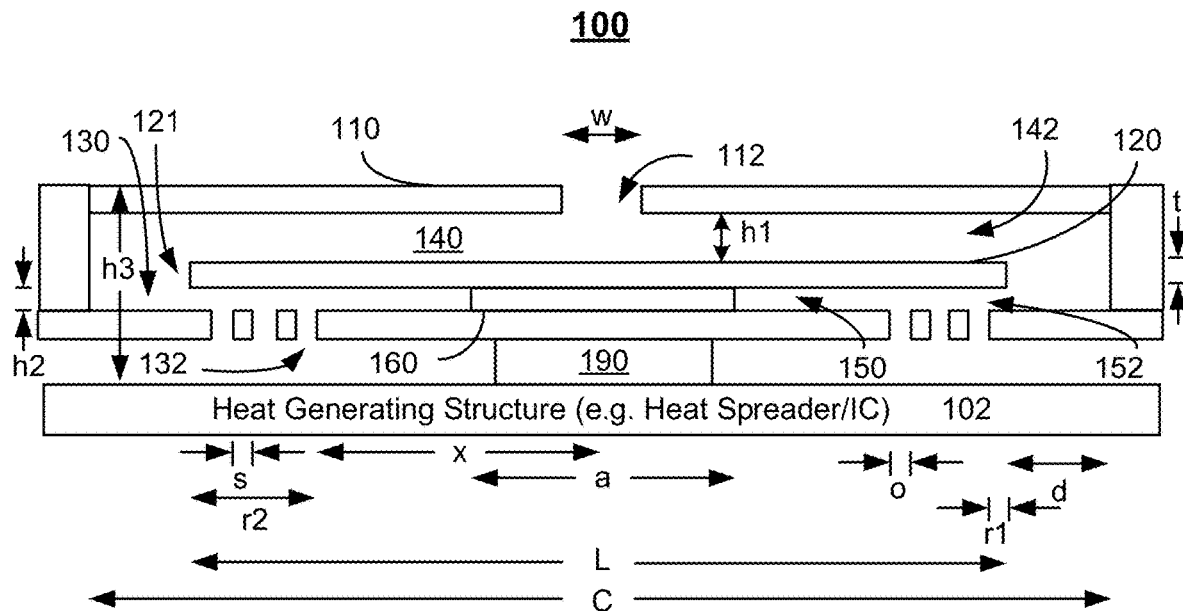
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling systems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components, because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions are desired.

A cooling system including a heat spreader, an active cooling element, and a base is described. The heat spreader is in thermal communication with a heat-generating structure mounted on a substrate. The heat spreader over hangs the heat-generating structure. In some embodiments, the heat spreader has a thickness of less than one millimeter. In some such embodiments, the heat spreader thickness is not more than five hundred micrometers. The active cooling element is in thermal communication with the heat spreader. The active cooling element may undergo vibrational motion when actuated to drive a fluid toward the heat spreader. The base supports the heat spreader and transfers a load from the heat spreader to the substrate such that a bending of the heat spreader does not exceed ten degrees. The base may be at least one millimeter thick. In some embodiments, the bending of the heat spreader is less than five degrees. The heat spreader may have an area and the base may have an outer perimeter. In some such embodiments, not more than ten percent of the area of the heat spreader overhangs the outer perimeter of the base. In some embodiments, the active cooling element and the heat spreader have a combined thickness of not more than three millimeters.

The base may have an aperture therein. The aperture is aligned with the heat-generating structure such that the base is not interposed between the heat spreader and the heat-generating structure. A distance between the heat spreader and the heat-generating structure may be not more than one hundred micrometers. In some embodiments, the heat-generating structure is offset from the active cooling element. In some embodiments, the base includes an insulating layer that electrically insulates the heat spreader from the substrate. The insulating layer may have a location selected from a bottom of the base and an interlayer within the base. The base may have a bottom, a portion of which may be conductive.

A system including a heat spreader, an active cooling system, and a base is described. The heat spreader is in thermal communication with a heat-generating structure mounted on a substrate. The heat spreader over hangs the heat-generating structure and has a heat spreader thickness not exceeding six hundred micrometers. The active cooling system includes active cooling cells. Each active cooling cell includes an active cooling element. The active cooling system is in thermal communication with the heat spreader. The active cooling element undergoes vibrational motion when actuated to drive a fluid toward the heat spreader. A combined thickness of the heat spreader and the active cooling system does not exceed four millimeters. A base supports the heat spreader and transfers a load from the heat spreader to the substrate such that a bending of the heat spreader does not exceed ten degrees. The base may have a thickness of at least one millimeter. In some embodiments, the base has an aperture therein. The aperture is aligned with the heat-generating structure such that the base is not interposed between the heat spreader and the heat-generating structure. The heat spreader is a distance of not more than one hundred micrometers from the heat-generating structure.

A method is described. The method includes driving a cooling element to induce a vibrational motion at a frequency. The vibrational motion drives a fluid toward a heat spreader that is in thermal communication with a heat-generating structure mounted on a substrate. The heat spreader over hangs the heat-generating structure. A base supports the heat spreader and transfers a load from the heat spreader to the substrate such that a bending of the heat spreader does not exceed ten degrees. The frequency may correspond to a structural resonant frequency of the cooling element and an acoustic resonant frequency for the cooling element.

Figure 1B:
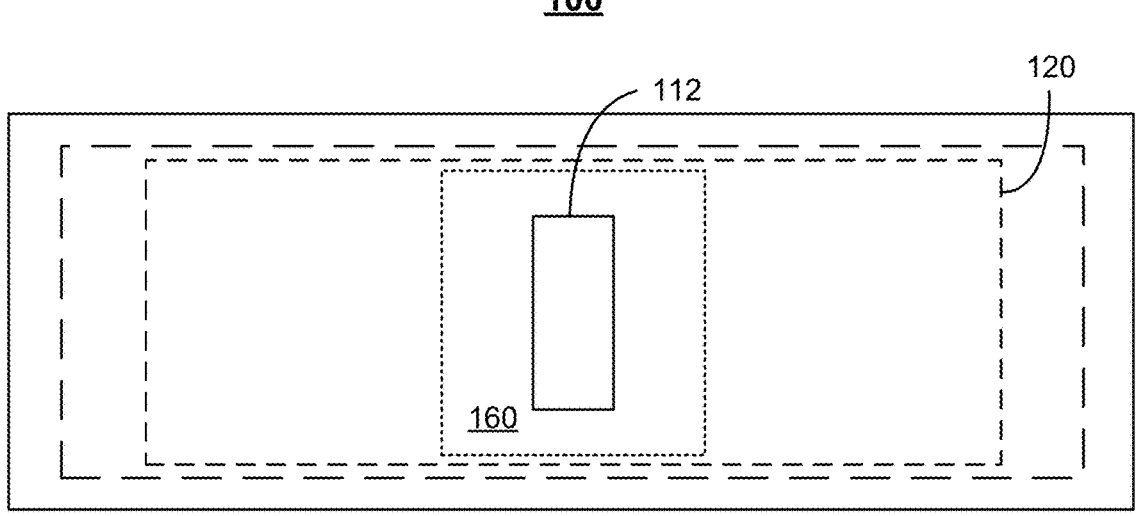
Figure 1C:
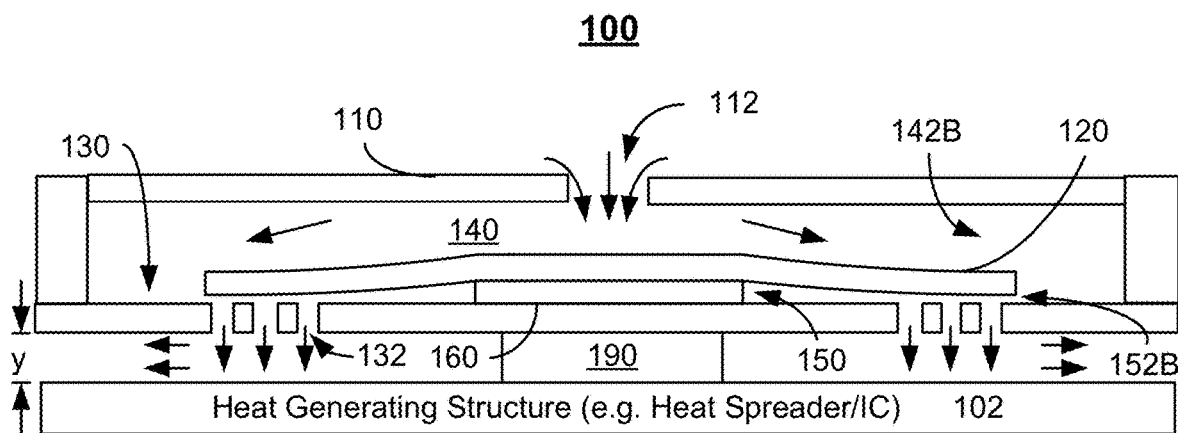
Figure 1D:
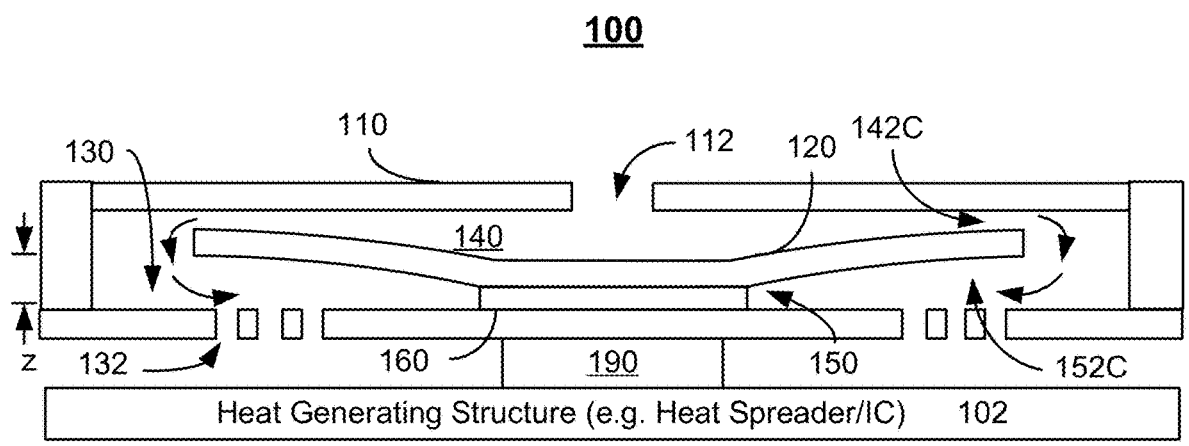
Figure 1E:
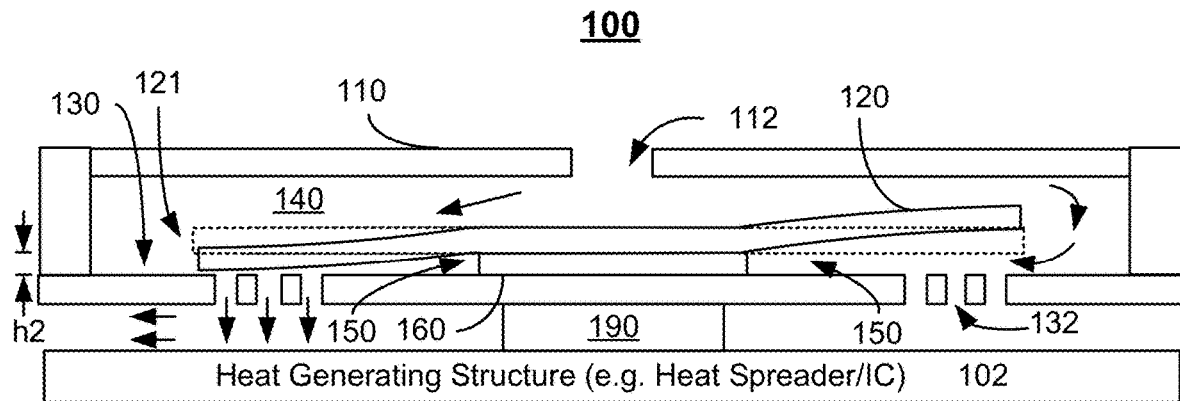
Figure 1F:
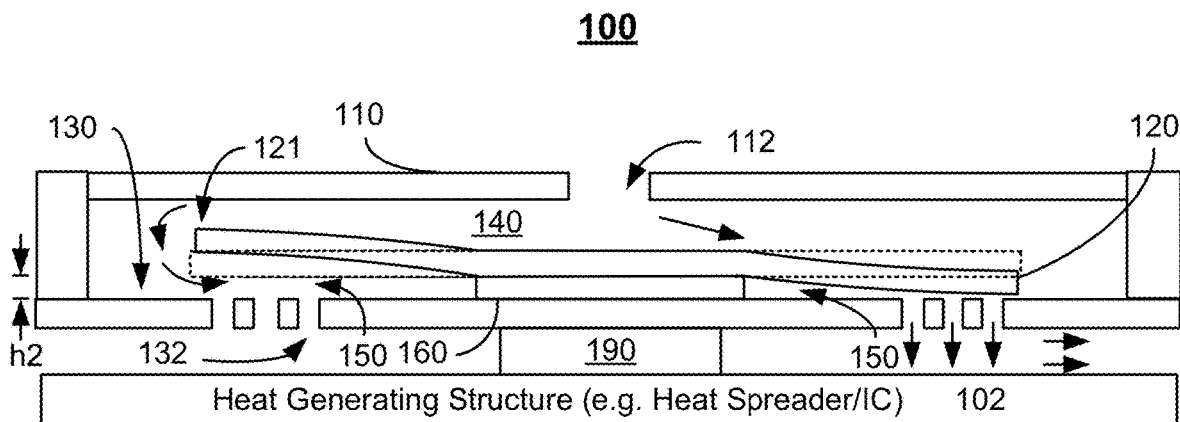
Figure 1G:
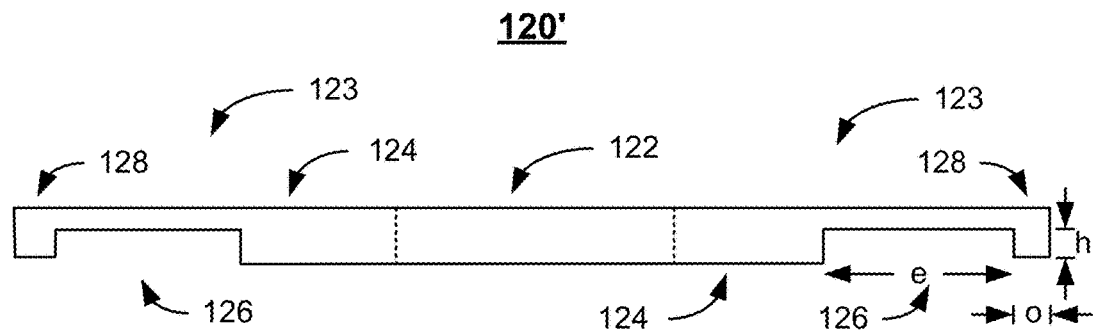

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C = \lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, $\nu$, is at or near the structural resonant frequency for cooling element 120. The frequency $\nu$ is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. $r1 \geq 100$ μm) and r2 is not more than one millimeter (e.g. $r2 \leq 1000$ μm). In some embodiments, orifices 132 are at least two hundred micrometers from tip 121 of cooling element 120 (e.g. $r1 \geq 200$ μm). In some such embodiments, orifices 132 are at least three hundred micrometers from tip 121 of cooling element 120 (e.g. $r1 \geq 300$ μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and IF is repeated. Thus, cooling element 120 undergoes vibrational motion indicated in FIGS. 1A, 1E, and IF, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
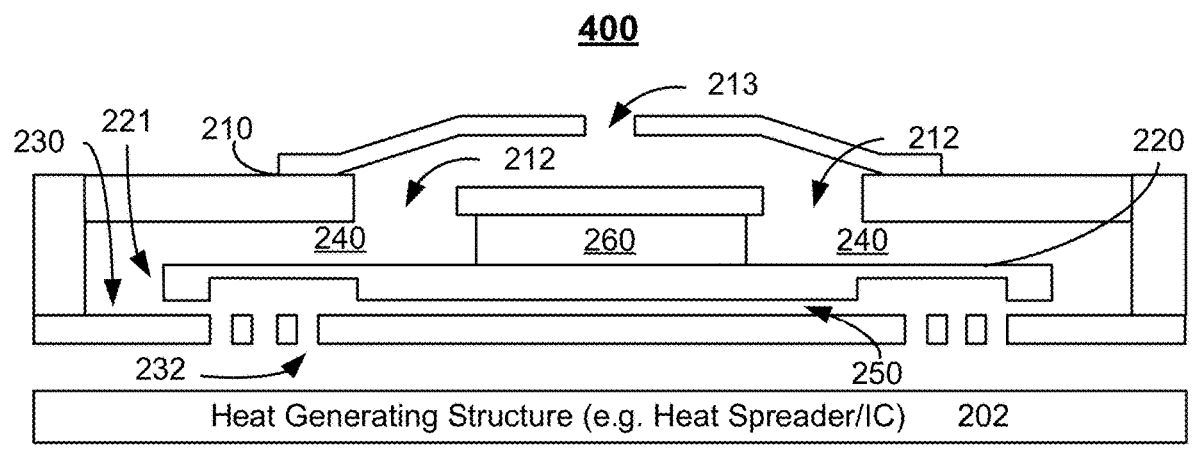
FIGS. 2A-2B depict an embodiment of an active MEMS cooling system including a centrally anchored cooling element.
Figure 2B:
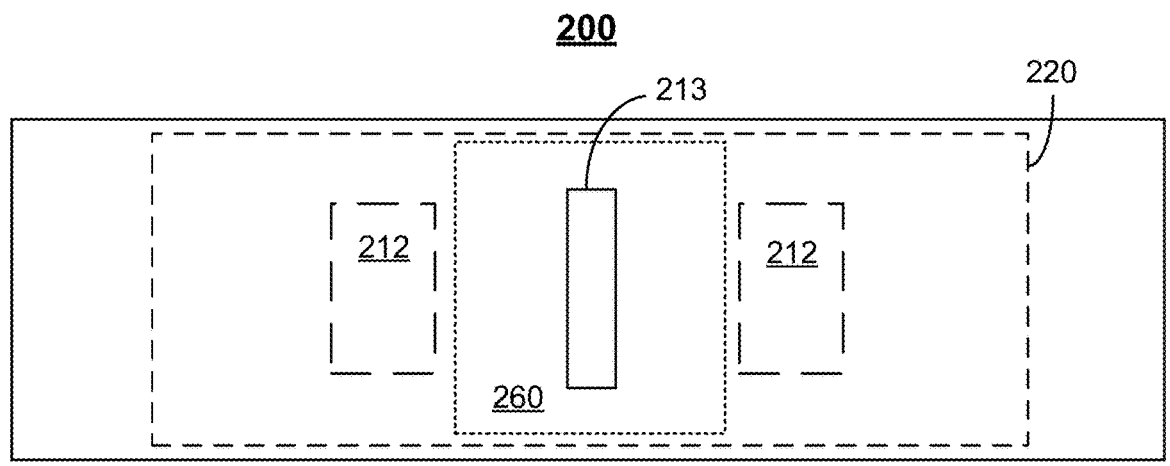

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown), may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
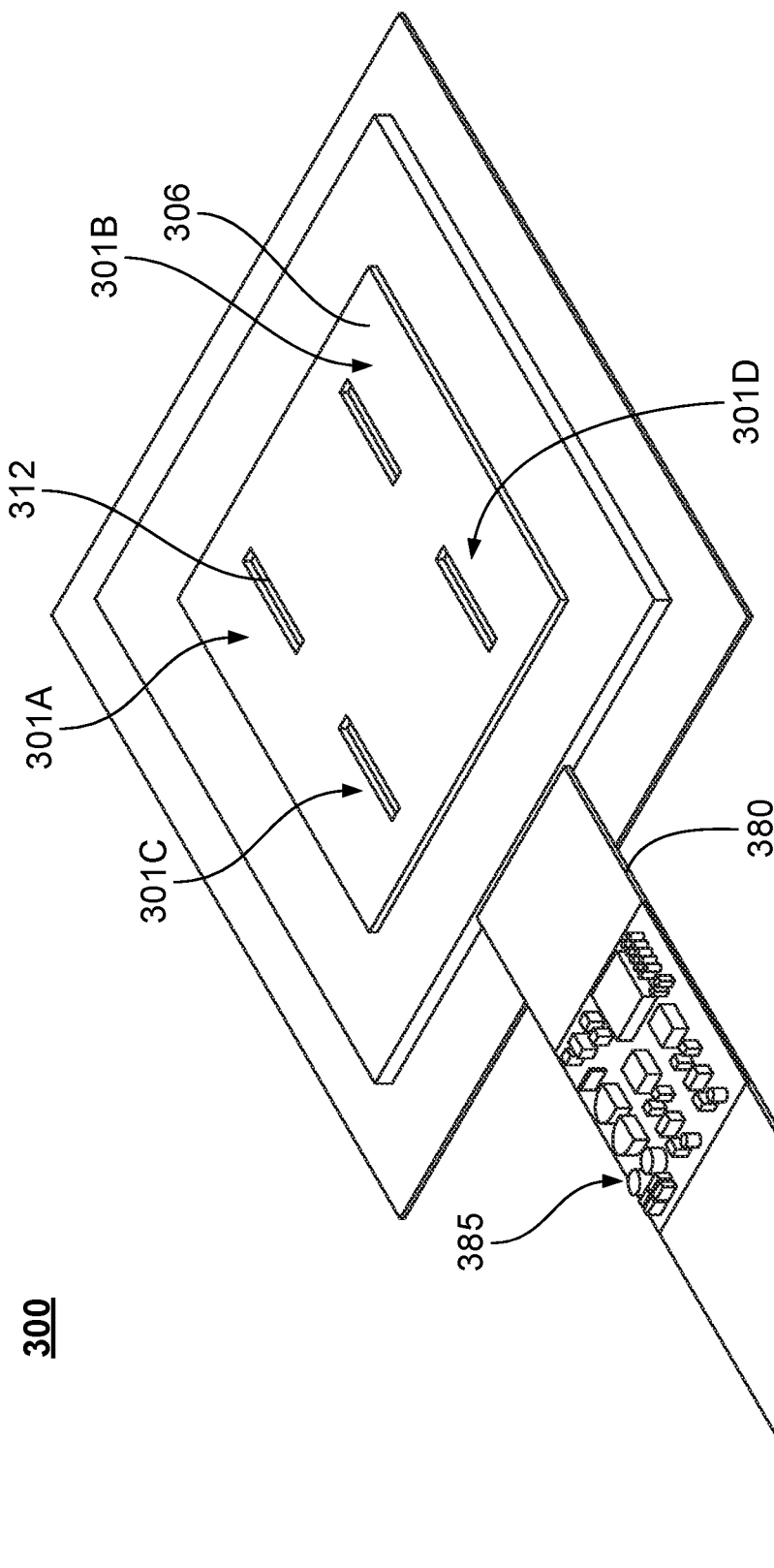
FIGS. 3A-3E depict an embodiment of an active MEMS cooling system formed in a tile.
Figure 3B:
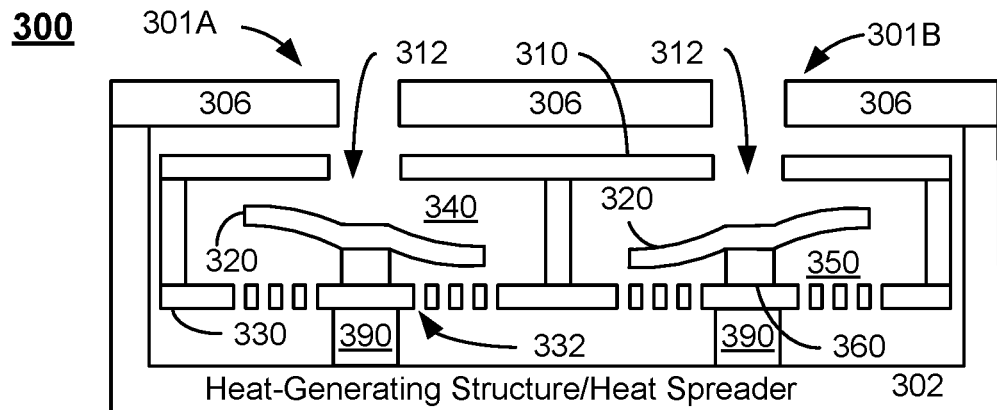
Figure 3C:
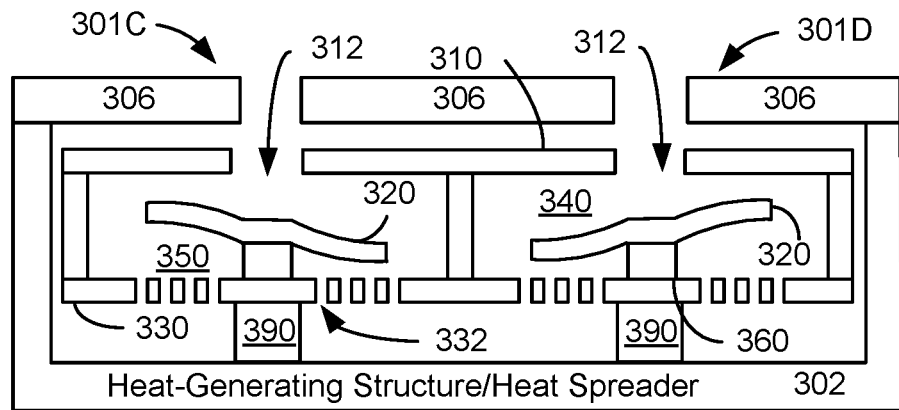
Figure 3D:
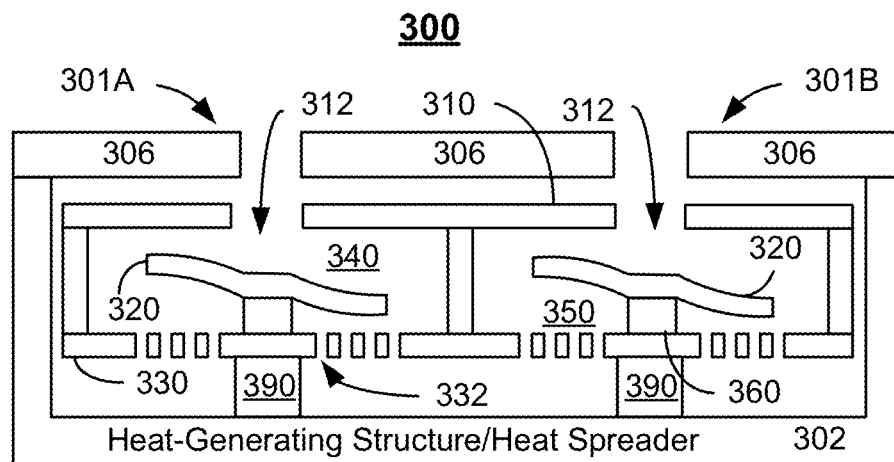
Figure 3E:
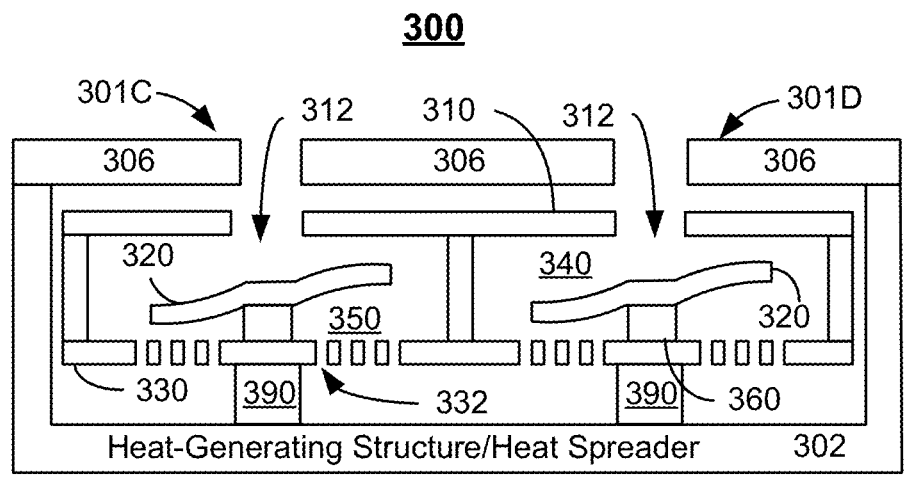

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4A:
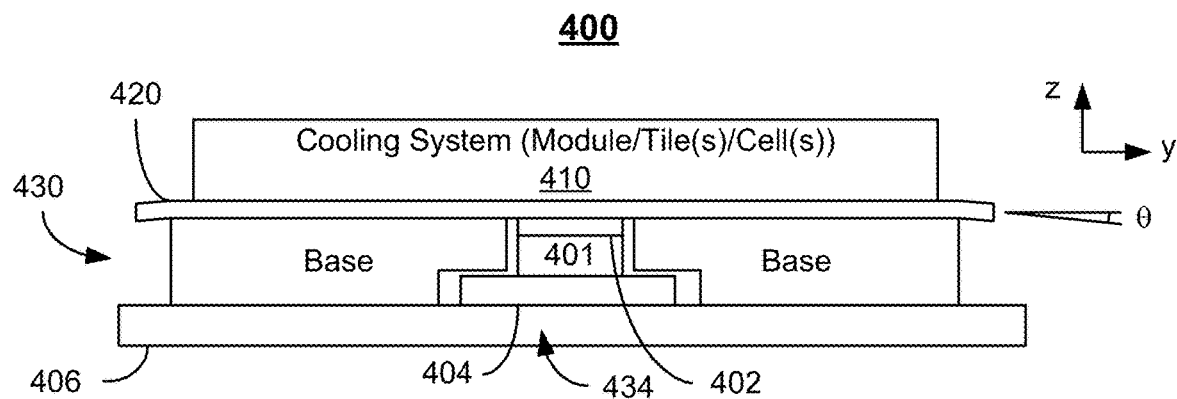
FIGS. 4A-4B depict an embodiment of an active cooling system including a base and heat spreader.
Figure 4B:
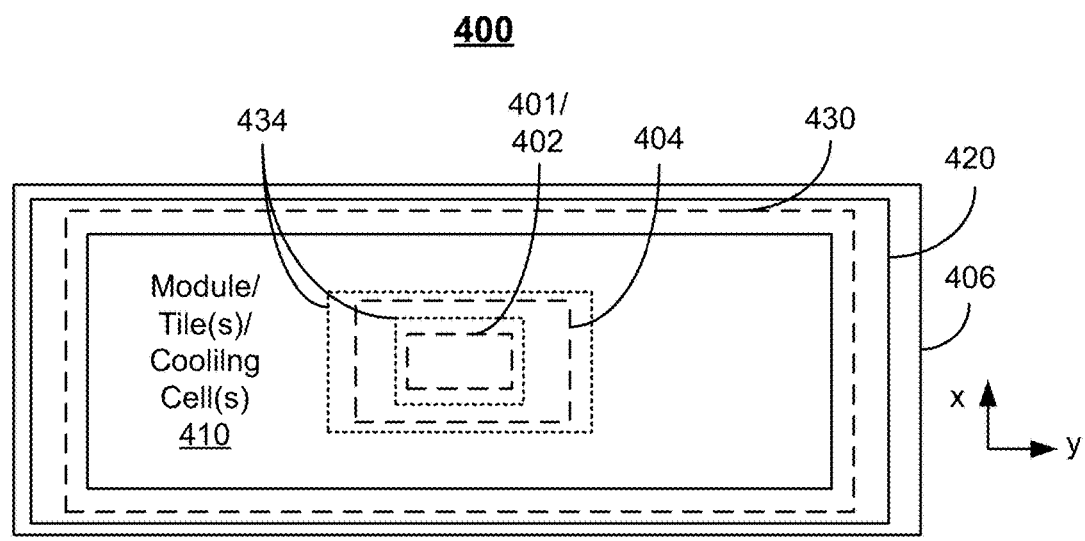

FIGS. 4A-4B depict an embodiment of active cooling system 400. FIG. 4A depicts a side view, while FIG. 4B depicts a top view. FIGS. 4A-4B are not to scale. Cooling system 400 includes MEMS cooling system 410, heat spreader 420, and base 430. MEMS cooling system 410 includes one or more cooling cells analogous to cooling systems 100 and/or 200. In some embodiments, MEMS cooling system 410 includes multiple cooling cells configured as a module termed a tile, or array. For example, MEMS cooling system 410 may include one or more tiles 300. Thus, MEMS cooling system 410 includes cooling element(s) configured to undergo vibrational motion when actuated to drive a fluid. MEMS cooling system 410 may also include top plate(s), anchor(s), orifice plate(s), and/or pedestal(s) analogous to those described in the context of cooling system 100 and/or 200. MEMS cooling system 410 may also include an integrated heat spreader and cover analogous to those described in the context of tile 300.

Also shown in FIGS. 4A-4B are heat-generating structure 401, thermal interface material (TIM) 402, and substrates 404 and 406. Heat-generating structure 401 is a component that is desired to be cooled. For example, heat-generating structure 401 may be an integrated circuit, such as a processor, or other device. During use, heat-generating structure 401 may rise significantly in temperature. For example, for heat-generating structure 401 being a processor, the top near heat spreader 420 may be on the order of ninety degrees Celsius and the junction temperature may be on the order of ninety-three to ninety four degrees Celsius. TIM 402 is utilized to improve thermal coupling between heat spreader 420 and heat-generating structure 401. For example, TIM 402 may be a thermal paste or tape. In some embodiments, TIM 402 may be omitted. Substrate 404 may be a printed circuit board (PCB) or other substrate on which heat-generating structure 401 is mounted. In some embodiments, substrate 404 may be omitted. Substrate 406 underlies cooling system 400, heat-generating structure 401, and substrate 404 (if present). Substrate 406 may be a PCB or other portion of a computing device or other device with which cooling system 400 is used. Heat-generating structure 401 may also be considered to be mounted on substrate 406, either directly or (as shown in FIG. 4A) via substrate 404.

Heat spreader 420 is in thermal communication with heat-generating structure 401. The heat spreader 420 overhangs (i.e. is not on and supported by) heat-generating structure 401. In some embodiments, at least thirty percent of the area (in the x-y plane) of heat spreader 420 overhangs heat-generating structure 401. In some embodiments, at least forty percent of the area of heat spreader 420 overhangs heat-generating structure 401. In some embodiments, at least fifty percent of the area of heat spreader 420 overhangs heat-generating structure 401. In some embodiments, at least seventy percent of the area of heat spreader 420 overhangs heat-generating structure 401. In some embodiments, heat spreader 420 has a thickness (in the z-direction) of less than one millimeter. In some such embodiments, heat spreader 420 has a thickness of not more than six hundred micrometers. In some such embodiments, heat spreader 420 has a thickness of not more than five hundred micrometers. Heat spreader 420 may be formed of copper or thermally conductive material.

MEMS cooling system 410 is thermally connected to heat spreader 420. Thus, the active cooling element(s) within MEMS cooling system 410 may be considered to be in thermal communication with heat spreader 420. MEMS cooling system 410 may have a thickness (in the z-direction) of not more than two millimeters. In some embodiments, MEMS cooling system 410 may have a thickness of not more than 1.5 millimeters. Thus, the combination of heat spreader 420 and MEMS cooling system 410 may have a total thickness of not more than four millimeters. In some embodiments, the total thickness of MEMS cooling system 410 and heat spreader 420 is not more than three millimeters. In some embodiments, the total thickness is not more than 2.5 millimeters. In some such embodiment, the total thickness of MEMS cooling system 410 and heat spreader 420 is not more than two millimeters. Thus, cooling system 400 may be accommodated in thin devices such as notebook computers, tablet computers, and/or laptop computers.

Because a portion of heat spreader 420 overhangs heat-generating structure 401 and heat spreader 420 is thin, heat spreader 420 would bend or otherwise deform without the presence of base 430. For example, heat spreader 420 might significantly deform and come into contact with substrate 406 if base 430 were absent. Deformation of heat spreader 420 may adversely affect the thermal connection between heat spreader 420 and heat-generating structure 401. Base 430 supports heat spreader 420 and transfers the load from heat spreader 420 to substrate 406. Thus, the bending and/or other deformation of heat spreader 420 is significantly reduced. For example, the bending of portions of heat spreader 420 may not exceed ten degrees (e.g. θ≤10°). In some embodiments, the bending of portions of heat spreader 420 does not exceed five degrees (e.g. θ≤5°).

Base 430 is thus sufficiently robust to carry heat spreader 420 and MEMS cooling system 410 without significant deformation. For example, base 430 may be at least one millimeter thick. In some embodiments, base 430 is at least two millimeters thick. Base 430 may also be thermally conductive. For example, base 430 may be or include copper. In some such embodiments, base 430 may include an electrically insulating layer such that base 430, heat spreader 420, and MEMS cooling system 410 are electrically insulated from substrate(s) 406 and/or 404. For example, portion(s) of the bottom of base 430 may be electrically insulating. In some embodiments, an insulating layer (e.g. a kapton interlayer) may be an interlayer within base 430.

In order to mitigate the deformation of heat spreader 420, base 430 may support a substantial portion of heat spreader 420. For example, heat spreader 420 may have an area and base 430 may have an outer perimeter. In some such embodiments, not more than ten percent of the area of heat spreader 420 overhangs (is not over/supported by) the outer perimeter of base 430. In some embodiments, heat spreader 420 may not overhang the outer perimeter of base 430. For example, heat spreader 420 may be the same size or smaller than base 430.

Base 430 also has aperture 434 therein. Aperture 434 is aligned with heat-generating structure 401, TIM 402, and substrate 404 such that base 430 is not interposed between heat spreader 420 and heat-generating structure 401. For example, the distance (e.g. in the z-direction) between heat spreader 420 and the top of heat-generating structure 401 may be not more than one hundred micrometers. Thus, heat spreader 420 may readily make thermal contact with heat-generating structure 401. Moreover, the total thickness of cooling system 400 (i.e. base 430, heat spreader 420, and MEMS cooling system 410) may be reduced. Although shown as having a profile that has contours analogous to those for heat-generating structure 401 and substrate 404, in some embodiments, aperture 434 may have substantially straight walls. For example, aperture 434 might have walls that are vertical (parallel to the z-direction) or angled such that the portion of aperture 434 closer to heat spreader 420 is smaller than the portion of aperture 434 closer to substrate 404. In some embodiments, base 430 may have a contoured edge (e.g. a cutout instead of a straight edge) or other geometry to accommodate heat-generating structure 401 instead of an aperture. In some such embodiments, heat-generating structure 401 may be near the edge of base 430. Further, although shown as centrally located in base 430 and heat spreader 420, heat-generating structure 401 may be offset from the center of base 430 and/or heat spreader 420. Heat-generating structure 401 is also shown as aligned with MEMS cooling system 410. In some embodiments, heat-generating structure 401 is offset from MEMS cooling system 410 and the active cooling element(s) therein.

System 400 may be integrated into a computing or other device by affixing base 430 to substrate 406 or other structure. For example, base 430 may include through holes (not shown in FIGS. 4A-4B) which may be used to screw base 430 onto substrate 406 or other structure. Heat spreader 420 is mounted to base 430, for example via screws and/or via an adhesive. MEMS cooling system 410 is mounted to heat spreader 420, or vice versa. In some embodiments, MEMS cooling system 410, heat spreader 420, and base 430 are coupled together and system 400 integrated into a device. In some embodiments, base 430, heat spreader 420, and MEMS cooling system 410 are individually incorporated into a device.

In operation, heat-generating structure 401 is energized and generates heat. For example, the processor is turned on. Heat from heat-generating structure 401 is transferred to heat spreader 420 because heat-generating structure 401 is thermally connected to heat spreader 420. In some embodiments, the heat is transferred via conduction. Heat spreader 420 removes heat from heat-generating structure 401 and spread the heat over a larger area, reducing hot spots. MEMS cooling system 410 operates in a manner analogous to system(s) 100, 200, and 300. Thus, a fluid (e.g. air) is drawn into cooling system 410 and driven onto heat spreader 420 and/or a portion of MEMS cooling system 410 that is thermally connected to heat spreader (e.g. heat spreader 302). Thus, heat from heat spreader 420 may be transferred to the fluid and removed from the region of heat-generating structure 401. Stated differently, heat is transferred from heat-generating structure 401 to heat spreader 420. The heat in heat spreader is transferred from heat spreader 420 to the fluid (and to MEMS cooling system 410 which may also be cooled by the fluid). The fluid removes the heat from the region of cooling system 400. In some embodiments, the fluid exiting the region of cooling system 400 entrains other air (not shown) to improve the cooling of the device in which cooling system 400 is incorporated. Heat-generating structure 401 and the device in which it is incorporated are, therefore, efficiently cooled. For example, heat-generating device 401 may be a processor may have an operating temperature of 93-94 degrees Celsius and a top temperature of approximately ninety degrees Celsius or more. However, because of cooling by MEMS cooling system 410, heat spreader 420 may have a lower temperature. For example, heat spreader 420 may have a temperature of 88-90 degrees Celsius. In some embodiments, heat spreader 420 may have a temperature of not more than seventy-five degrees Celsius for heat-generating device 401 having a top temperature of ninety degrees Celsius. For example, heat spreader 420 may have a temperature of 70-75 degrees Celsius. In some embodiments, heat spreader 420 may have a lower temperature. Under these conditions heat-generating structure 401 operates at a lower temperature due to limits imposed by the touch temperature limits for specific devices employing the cooling system.

Thus, cooling system 400 efficiently cools heat-generating structure 401. Because of the thickness of heat spreader 420 and MEMS cooling system 410, this may be accomplished in a thin device such as a notebook computer, tablet computer, laptop computer, mobile phone, or other device in which the size may be constrained in the z direction. Further, system 400 may provide analogous cooling in other devices including but not limited to servers, where space is less limited. Because of the presence of base 430, MEMS cooling system 410 and heat spreader 420 may be affixed in the desired position in the device including heat-generating structure 401. Further, bending and/or other deformation of heat spreader 420 may be reduced or eliminated. Consequently, good thermal contact between heat spreader 420 and heat-generating structure 401 may be maintained in a confined region. Thermal management of the device incorporating heat-generating structure 401 may thus be improved.

Figure 5A:
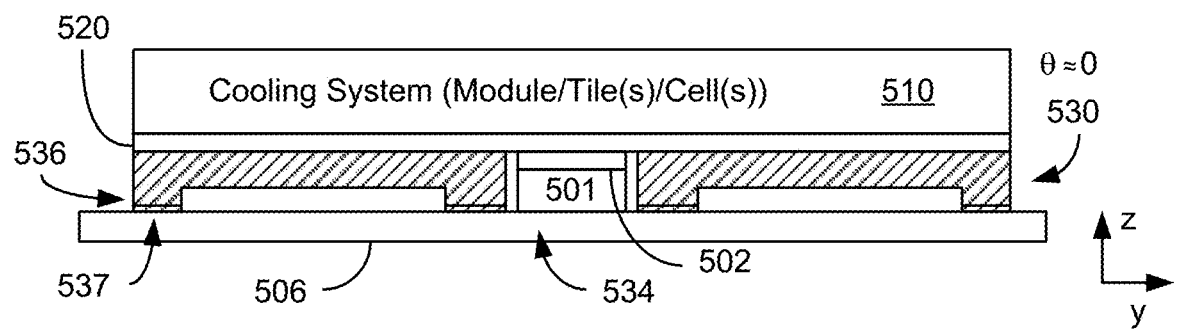
FIGS. 5A-5B depict an embodiment of an active cooling system including a base and heat spreader.
Figure 5B:
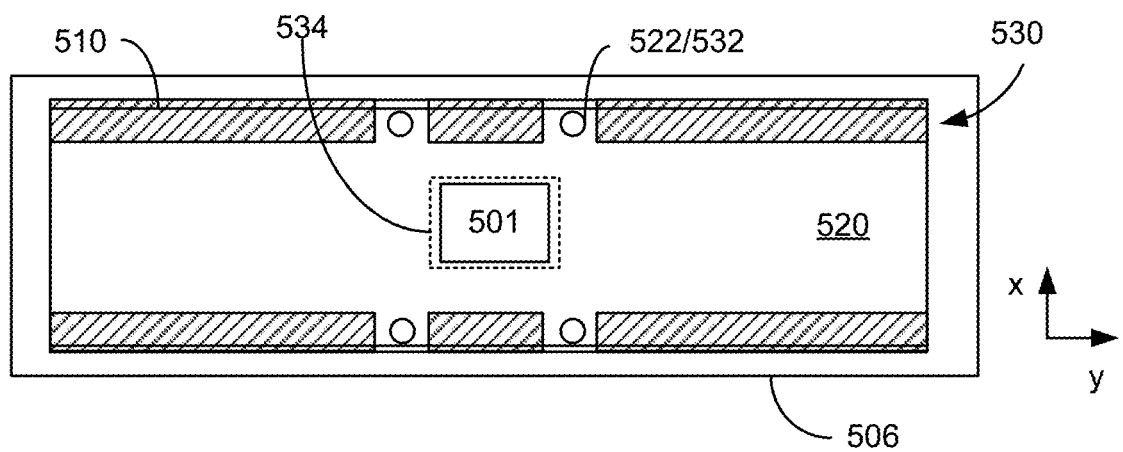

FIGS. 5A-5B depict an embodiment of cooling system 500. FIG. 5A depicts a side view, while FIG. 5B depicts a top view. FIGS. 5A-5B are not to scale. Cooling system 500 is analogous to cooling system 400 and includes MEMS cooling system 510, heat spreader 520, and base 530 that are analogous to MEMS cooling system 410, heat spreader 420, and base 430, respectively. MEMS cooling system 510 includes one or more cooling cells analogous to cooling systems 100 and/or 200. In some embodiments, MEMS cooling system 510 includes multiple cooling cells configured as a module termed a tile, or array. For example, MEMS cooling system 510 may include one or more tiles 300. Thus, MEMS cooling system 510 includes cooling element(s) configured to undergo vibrational motion when actuated to drive a fluid. MEMS cooling system 510 may also include top plate(s), anchor(s), orifice plate(s), and/or pedestal(s) analogous to those described in the context of cooling system 100 and/or 200. MEMS cooling system 510 may also include an integrated heat spreader and cover analogous to those described in the context of tile 300.

Also shown in FIGS. 5A-5B are heat-generating structure 501, TIM 502, and substrate 506 that are analogous to heat-generating structure 401, TIM 402, and substrate 406, respectively. Heat-generating structure 501 is a component that is desired to be cooled, such as an integrated circuit, such as a processor, or other device. TIM 502 is utilized to improve thermal coupling between heat spreader 520 and heat-generating structure 501. In some embodiments, TIM 502 may be omitted. Substrate 506 may be a PCB or other substrate on which heat-generating structure 501 is mounted.

Heat spreader 520 is in thermal communication with heat-generating structure 501. The heat spreader 520 overhangs heat-generating structure 501 in a manner analogous to that described with respect to cooling system 400. In some embodiments, heat spreader 520 has a thickness (in the z-direction) of less than one millimeter. In some such embodiments, heat spreader 520 has a thickness of not more than six hundred micrometers. In some such embodiments, heat spreader 520 has a thickness of not more than five hundred micrometers. Heat spreader 520 may be formed of copper or thermally conductive material. Also shown are through holes 522 that can be used to affix heat spreader 520 to base 530.

MEMS cooling system 510 is thermally connected to heat spreader 520. Thus, the active cooling element(s) within MEMS cooling system 510 may be considered to be in thermal communication with heat spreader 520. MEMS cooling system 510 may have a thickness (in the z-direction) of not more than two millimeters. In some embodiments, MEMS cooling system 510 may have a thickness of not more than 1.5 millimeters. Thus, the combination of heat spreader 520 and MEMS cooling system 510 may have a total thickness of not more than four millimeters. In some embodiments, the total thickness of MEMS cooling system 510 and heat spreader 520 is not more than three millimeters. In some embodiments, the total thickness is not more than 2.5 millimeters. In some such embodiment, the total thickness of MEMS cooling system 510 and heat spreader 520 is not more than two millimeters. Thus, cooling system 500 may be accommodated in thin devices such as notebook computers, tablet computers, and/or laptop computers.

Because a portion of heat spreader 520 overhangs heat-generating structure 501 and heat spreader 520 is thin, heat spreader 520 would bend or otherwise deform without the presence of base 530. Deformation of heat spreader 520 may adversely affect the thermal connection between heat spreader 520 and heat-generating structure 501. Base 530 supports heat spreader 520 and transfers the load from heat spreader 520 to substrate 506. Thus, the bending and/or other deformation of heat spreader 520 is significantly reduced. For example, the bending of portions of heat spreader 520 may be in the ranges described with respect to heat spreader 420. In the embodiment shown, except for aperture 534, heat spreader 520 does not extend beyond the boundaries of base 530. Thus, bending may be substantially eliminated for heat spreader 520.

Base 530 is thus sufficiently robust to carry heat spreader 520 and MEMS cooling system 510 without significant deformation. For example, base 530 may have thicknesses analogous to those described for base 430. Base 530 may also be thermally conductive. For example, base 530 may be or include copper. In some such embodiments, base 530 may include an electrically insulating layer such that base 530, heat spreader 520, and MEMS cooling system 510 are electrically insulated from substrate 506. For example, base 530 includes feet 526 including insulating portions 537, of which only one is labeled in FIG. 5A. Base 530 supports a substantial portion of heat spreader 520. For example, in the embodiment shown, heat spreader 520 does not overhang base 530. Instead, heat spreader extends across only a portion of base 530. In other embodiments, heat spreader 520 may overhang base 530 in an analogous manner to that discussed with respect to system 400. In some embodiments, heat spreader 520 may have the same footprint as base 530. Also shown are through holes 532 that may be used to affix base 530 to substrate 506 and/or to affix heat spreader 520 to base 530.

Base 530 also has aperture 534 therein. Aperture 534 is aligned with heat-generating structure 501, TIM 502, and substrate 504 such that base 530 is not interposed between heat spreader 520 and heat-generating structure 501. For example, the distance (e.g. in the z-direction) between heat spreader 520 and the top of heat-generating structure 501 may be not more than one hundred micrometers. Thus, heat spreader 520 may readily make thermal contact with heat-generating structure 501. Moreover, the total thickness of cooling system 500 (i.e. base 530, heat spreader 520, and MEMS cooling system 510) may be reduced. Although with a particular profile, aperture 534 may be differently shaped. In some embodiments, base 530 may have a contoured edge or other geometry to accommodate heat-generating structure 501 instead of an aperture. In some such embodiments, heat-generating structure 501 may be near the edge of base 530. Although shown as centrally located in base 530 and heat spreader 520, heat-generating structure 501 may be offset from the center of base 530 and/or heat spreader 520. Heat-generating structure 501 is also shown as aligned with MEMS cooling system 510. In some embodiments, heat-generating structure 501 is offset from MEMS cooling system 510 and the active cooling element(s) therein.

System 500 may be integrated into a computing or other device in an analogous manner to system 400. System 500 operates in an analogous manner to system 400 and may have similar benefits. Thus, system 500 more efficiently cools heat-generating structure 501 and the device in which it is incorporated. Consequently, heat-generating structure 501 may run for longer at higher power (e.g. without or with reduced throttling). Performance of the device may thus be improved. Because of the thickness of heat spreader 520 and MEMS cooling system 510, this may be accomplished in a thin device such as a notebook computer, tablet computer, laptop computer, mobile phone, or other device in which the size may be constrained in the z direction. Further, system 500 may provide analogous cooling in other devices including but not limited to servers, where space is less limited. Because of the presence of base 530, MEMS cooling system 510 and heat spreader 520 may be affixed in the desired position in the device including heat-generating structure 501. Further, bending and/or other deformation of heat spreader 520 may be reduced or eliminated. Consequently, good thermal contact between heat spreader 520 and heat-generating structure 501 may be maintained in a confined region. Thermal management of the device incorporating heat-generating structure 501 may thus be improved.

Figure 6:
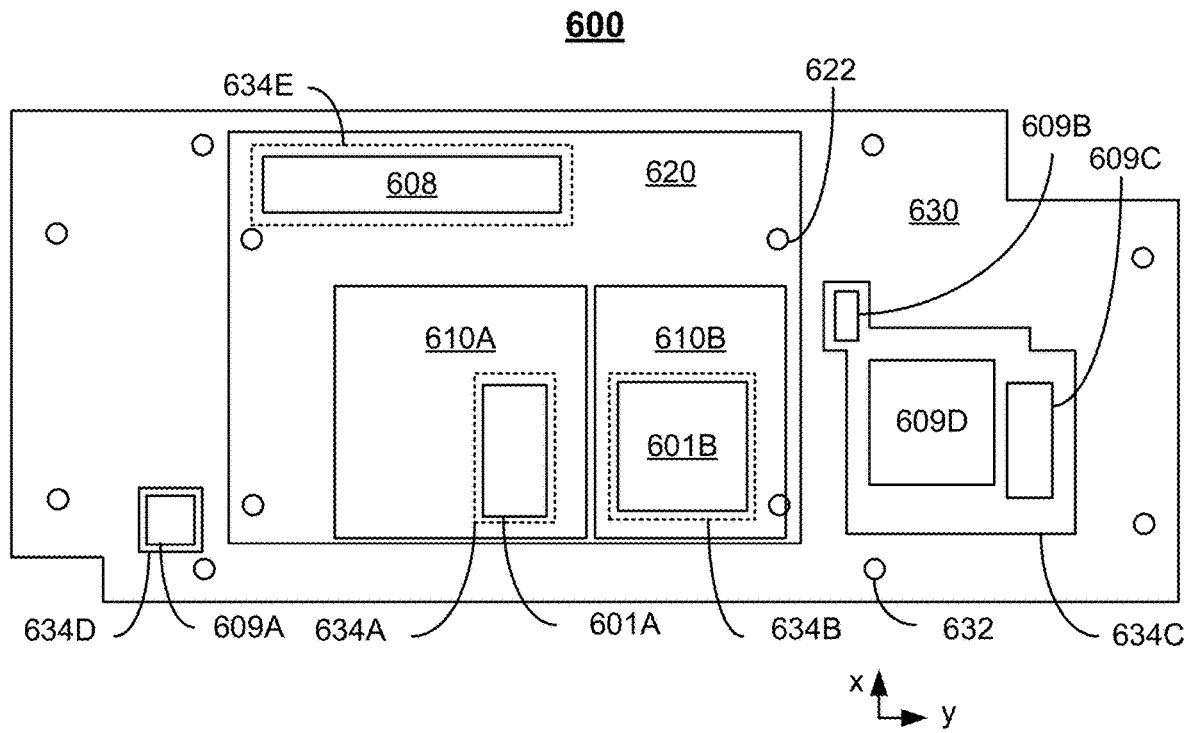
FIG. 6 depicts an embodiment of an active cooling system including a base and heat spreader.

FIG. 6 depicts a top view of an embodiment of cooling system 600. FIG. 6 is not to scale. Cooling system 600 is analogous to cooling system(s) 400 and/or 500 and includes MEMS cooling systems 610A and 610B (collectively or generically MEMS cooling system 600), heat spreader 620, and base 630 that are analogous to MEMS cooling system 410 and/or 510, heat spreader 420 and/or 520, and base 430 and/or 530, respectively. Although one heat spreader 620 is shown as being coupled with base 630, multiple heat spreaders may be present. MEMS cooling system 610 includes one or more cooling cells analogous to cooling systems 100 and/or 200. In some embodiments, MEMS cooling system 610 includes multiple cooling cells configured as a module termed a tile, or array. For example, MEMS cooling system 610 may include one or more tiles 300. Thus, MEMS cooling system 610 includes cooling element(s) configured to undergo vibrational motion when actuated to drive a fluid. MEMS cooling system 610 may also include top plate(s), anchor(s), orifice plate(s), and/or pedestal(s) analogous to those described in the context of cooling system 100 and/or 200. MEMS cooling system 610 may also include an integrated heat spreader and cover analogous to those described in the context of tile 300.

Also shown in FIG. 6 are heat-generating structures 601A and 601B (which may be covered by TIM that is not shown) and an underlying substrate (not shown) that are analogous to heat-generating structure 401 and/or 501 and substrate 406 and/or 406, respectively. Heat-generating structures 601A and 601B are components that are desired to be cooled, such as integrated circuit(s) and/or other device(s). Also shown are structure(s) 608, 609A, 609B, 609C, and 609D. Structure(s) 608 may include one or more heat-generating components. However, the desired thermal management for the device in which system 600 is incorporated may be provided simply through the use of heat spreader 620. Similarly, structure(s) 609A, 609B, 609C, and 609D may include one or more heat generating component(s). However, the desired thermal management for the device in which system 600 is incorporated may be provided through the use of entrainment due to MEMS cooling systems 610 or without additional cooling.

Heat spreader 620 is in thermal communication with heat-generating structures 601A, 601B, and 608. The heat spreader 620 overhangs heat-generating structures 601A, 601B, and 608 in a manner analogous to that described with respect to cooling systems 400 and 500. In some embodiments, heat spreader 620 has a thickness (in the z-direction perpendicular to the plane of the page) of less than one millimeter. In some such embodiments, heat spreader 620 has a thickness of not more than six hundred micrometers. In some such embodiments, heat spreader 620 has a thickness of not more than five hundred micrometers. Heat spreader 620 may be formed of copper or thermally conductive material. Also shown are through holes 622 in heat spreader 620 that can be used to affix heat spreader 620 to base 630. Further, in some embodiments, heat spreader 620 might be separated into multiple heat spreaders. For example, one heat spreader might be used for heat-generating structures 601A and 601B and another heat spreader for structure 608.

MEMS cooling systems 610 are thermally connected to heat spreader 620. Although two MEMS cooling system 610 are shown, in some embodiments, a single MEMS cooling system having the desired cooling power (e.g. the same as cooling systems 610A and 610B) may be used. Thus, the active cooling element(s) within MEMS cooling systems 610 may be considered to be in thermal communication with heat spreader 620. MEMS cooling systems 610 may each have a thickness (in the z-direction perpendicular to the plane of the page) of not more than two millimeters. In some embodiments, MEMS cooling systems 610 may each have a thickness of not more than 1.5 millimeters. Thus, the combination of heat spreader 620 and MEMS cooling systems 610 may have a total thickness of not more than four millimeters. In some embodiments, the total thickness of MEMS cooling systems 610 and heat spreader 620 is not more than three millimeters. In some embodiments, the total thickness is not more than 2.5 millimeters. In some such embodiment, the total thickness of MEMS cooling systems 610 and heat spreader 620 is not more than two millimeters. Thus, cooling system 600 may be accommodated in thin devices such as notebook computers, tablet computers, and/or laptop computers.

Because a portion of heat spreader 620 overhangs heat-generating structures 601A, 601B, and 608 and because heat spreader 620 is thin, heat spreader 620 would bend or otherwise deform without the presence of base 630. Deformation of heat spreader 620 may adversely affect the thermal connection between heat spreader 620 and heat-generating structure 601. Base 630 supports heat spreader 620 and transfers the load from heat spreader 620 to the underlying substrate (and/or other structures). Thus, the bending and/or other deformation of heat spreader 620 is significantly reduced. For example, the bending of portions of heat spreader 620 may be in the ranges described with respect to heat spreader 420. In the embodiment shown, except for aperture 634, heat spreader 620 does not extend beyond the boundaries of base 630. Thus, bending may be substantially eliminated for heat spreader 620. Also shown are through holes 632 than can be used to affix base 630 to an underlying substrate (and/or other structure) and/or to affix heat spreader 620 to base 630.

Base 630 is thus sufficiently robust to carry heat spreader 620 and MEMS cooling systems 610 without significant deformation. For example, base 630 may have thicknesses analogous to those described for base 430. Base 630 may also be thermally conductive. For example, base 630 may be or include copper. In some such embodiments, base 630 may include an electrically insulating layer such that base 630, heat spreader 620, and MEMS cooling system 610 are electrically insulated from substrate 606.

Base 630 also has apertures 634A, 634B, 634C, 634D, and 634E therein. Apertures 634A, 634B, and 634E are under heat spreader 620. Apertures 634A and 634B are aligned with heat-generating structures 601A and 601B such that base 630 is not interposed between heat spreader 620 and heat-generating structures 601A, 601B, and 608. For example, the distance (e.g. in the z-direction) between heat spreader 620 and the tops of heat-generating structures 601A, 601B, and/or 608 may be not more than one hundred micrometers. Thus, heat spreader 620 may readily make thermal contact with heat-generating structures 601A, 601B, and 608. Moreover, the total thickness of cooling system 600 (i.e. base 630, heat spreader 620, and MEMS cooling systems 610) may be reduced. Apertures 634C and 634D accommodate components 609A, 609B, 609C, and 609D. Thus, base 630 may extend over a larger region without interfering with and allowing for other cooling of additional components 609A, 609B, 609C, and 609D.

Although shown with particular profiles, apertures 634A, 634B, 634C, 634D, and/or 634E may be differently shaped. In some embodiments, base 630 may have a contoured edge or other geometry to accommodate structures 601A, 601B, 608, 609A, 609B, 609C, and/or 609D instead of apertures. Heat-generating structures 601A and 601B are also shown as aligned with MEMS cooling systems 610A and 610B. In some embodiments, heat-generating structure(s) 601A and/or 601B may be offset from MEMS cooling system(s) 610A and/or 610B and the active cooling element(s) therein.

System 600 may be integrated into a computing or other device in an analogous manner to system 400. System 600 operates in an analogous manner to system 400 and may have similar benefits. Thus, system 600 more efficiently cools heat-generating structures 601A, 601B and 608 and the device in which it is incorporated. Consequently, heat-generating structures 601A, 601B, and/or 608 may run for longer at higher power (e.g. without or with reduced throttling). Performance of the device may thus be improved. Because of the thickness of heat spreader 620 and MEMS cooling systems 610A and 610B, this may be accomplished in a thin device such as a notebook computer, tablet computer, laptop computer, mobile phone, or other device in which the size may be constrained in the z direction. Further, system 600 may provide analogous cooling in other devices including but not limited to servers, where space is less limited. Because of the presence of base 630, MEMS cooling systems 610A and 610B and heat spreader 620 may be affixed in the desired position in the device including heat-generating structures 601A, 601B, and 608. Further, bending and/or other deformation of heat spreader 620 may be reduced or eliminated. Consequently, good thermal contact between heat spreader 620 and heat-generating structures 601A, 601B, and 608 may be maintained in a confined region. Thermal management of the device incorporating heat-generating structures 601A, 601B, and 608 may thus be improved.

Figure 7:
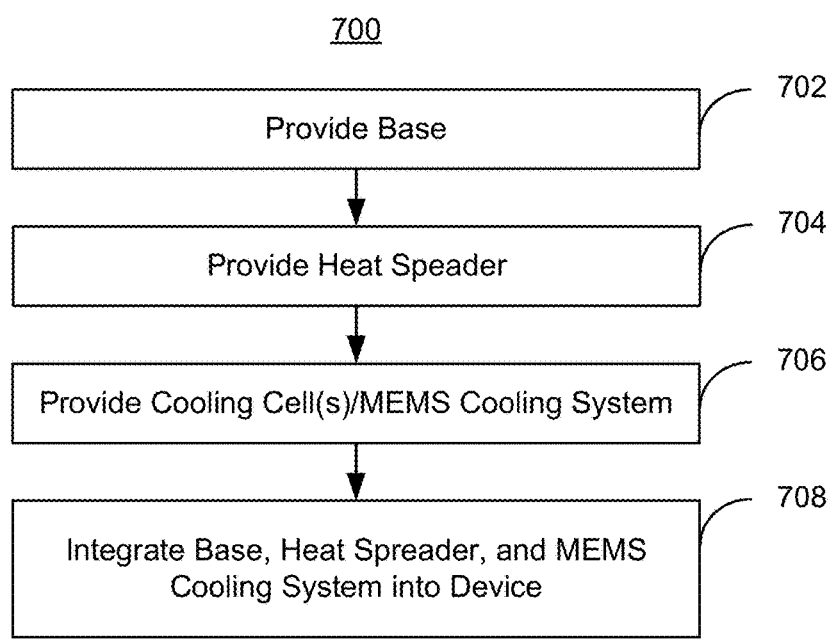
FIG. 7 depicts an embodiment of a method for providing an active cooling system including a base and heat spreader.

FIG. 7 depicts an embodiment of method 700 for providing an active cooling system including a base and heat spreader. Method 700 may include steps that are not depicted for simplicity. Method 700 is described in the context of system 400. However, method 700 may be used with other cooling systems including but not limited to systems 100, 200, 300, 500, and/or 600 and cells described herein. Method 700 is also described in the context of forming a single system. However, method 700 may be used to fabricated multiple systems substantially in parallel.

A base for supporting a MEMS cooling and heat spreader is provided, at 702. 702 includes providing apertures, through holes, insulating layer(s)/structures and/or other portions of the base. The heat spreader is provided, at 704. The heat spreader may include through holes or other structures. The MEMS cooling system is provided, at 706. In some embodiments, 706 may include providing cooling system(s) 100 and/or 200. In some embodiments, 706 may also include forming one or more tiles, analogous to tile 300.

The base, heat spreader, and MEMS cooling system are integrated into the device including heat-generating structure(s), at 708. In some embodiments, the base, heat spreader, and MEMS cooling system are coupled together to form a module and the module incorporated into the device. In some embodiments, the base, heat spreader, and MEMS cooling system are individually integrated into the device that includes heat-generating structures.

For example, base 430 may be provided, at 702. Heat spreader 420 and MEMS cooling system 410 may be fabricated at 704 and 706, respectively. System 400 may be integrated into a computing or other device, at 708. For example base 430 may be affixed to substrate 406 via screws (not shown in FIGS. 4A and 4B). Heat spreader 420 may be mounted to base 430 and MEMS cooling system 410 mounted to heat spreader 420. In some embodiments, 708 includes coupling MEMS cooling system 410, heat spreader 420, and base 430 together into an integrated module. The module may then be incorporated into a device. For example, base 430 and heat spreader 420 may be affixed to substrate 406 via screws. Thus, cooling system(s) 400, 500, and/or 600 may be provided and used in a device. Thus, the benefits described herein may be achieved.

Figure 8:
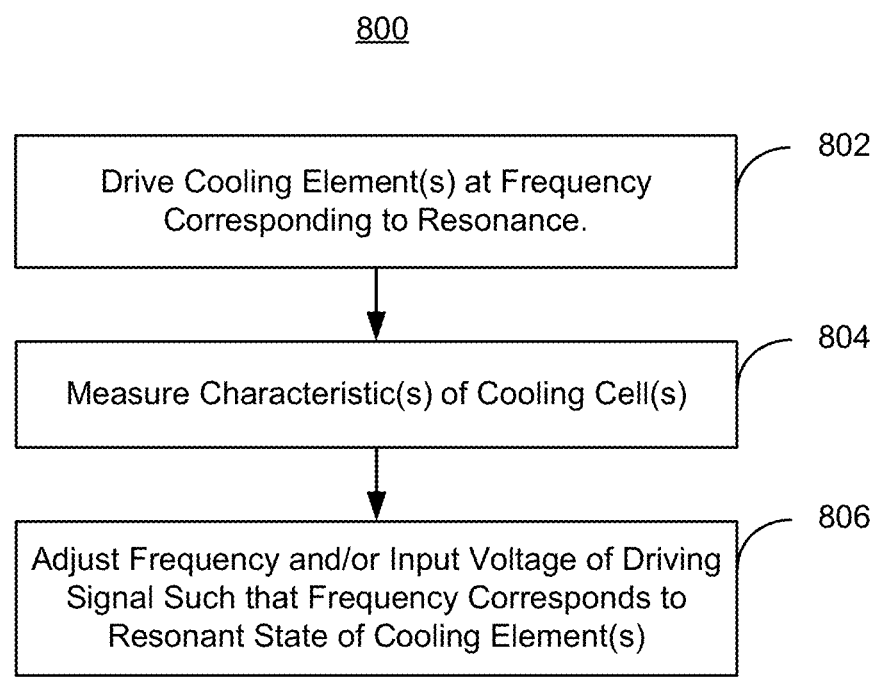
FIG. 8 depicts an embodiment of a method for using an active cooling system including a base and a heat spreader.

FIG. 8 depicts an embodiment of method 800 for using an active cooling system including a base and a heat spreader. Method 800 may include steps that are not depicted for simplicity. Method 800 is described in the context of system 400. However, method 800 may be used with other cooling systems including but not limited to systems and cells described herein.

A driving signal at a frequency and an input voltage corresponding to the resonant state of one or more cooling elements is provided to the active MEMS cooling system, at 802. In some embodiments, a driving signal having the frequency corresponding to the resonant frequency of a specific cooling element is provided to that cooling element.

In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Characteristic(s) of the MEMS cooling system are monitored while the cooling element(s) are driven to provide a feedback signal corresponding to a proximity to a resonant state of the cooling element(s), at 804. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 804. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the at cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

The frequency and/or input voltage is adjusted based on the feedback signal, at 806. More specifically, 806 includes updating the frequency and/or input voltage, based on the feedback signal, to correspond to resonant state(s) of the cooling element(s) at 806. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 806 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling elements in MEMS cooling system 410 are driven, at 802. Thus, the cooling elements in MEMS cooling system 410 are driven at a frequency that is at or near resonance for one or more of the cooling elements. Characteristics of the cooling elements within MEMS cooling system 410 are monitored, at 804. Thus, the drift of the cooling element(s) from resonance may be determined. The frequency may be adjusted based on the monitoring of 804, at 806. Thus, MEMS cooling system 410 may be kept at or near resonance.

Thus, using method 800, an active cooling system, such as cooling system(s) 100, 200, 300, 410, 510, and/or 610 may be efficiently driven. Further, because the characteristic(s) of the MEMS cooling system are monitored, drifts in the resonant frequency may be discovered and accounted for. Thus, method 800 may be used to operate active MEMS cooling systems and achieve the benefits thereof.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
   a heat spreader in thermal communication with a heat-generating structure mounted on a substrate, the heat spreader over hanging the heat-generating structure;
   an active cooling element in thermal communication with the heat spreader, the active cooling element being in an active cooling system, the active cooling system also including a top plate and an orifice plate, the top plate including at least one vent therein corresponding to the active cooling element, the orifice plate including at least one orifice corresponding to the active cooling element, the active cooling element being between the top plate and the orifice plate, wherein vibrational motion of the active cooling element draws a fluid in through the at least one vent of the top plate and out through the at least one orifice in the orifice plate toward the heat spreader; and
   a base supporting the heat spreader and transferring a load from the heat spreader to the substrate such that a bending of the heat spreader does not exceed ten degrees;
   wherein the base has an aperture therein, the aperture being aligned with the heat-generating structure such that the base is not interposed between the heat spreader and the heat-generating structure; and
   wherein the active cooling system and the heat spreader have a combined thickness of not more than three millimeters.

2. The cooling system of claim 1, wherein the bending of the heat spreader is less than five degrees.

3. The cooling system of claim 1, wherein the heat spreader has a thickness of less than one millimeter.

4. The cooling system of claim 3, wherein the heat spreader has a thickness of not more than five hundred micrometers.

5. The cooling system of claim 1, wherein the heat-generating structure is offset from the active cooling element.

6. The cooling system of claim 1, wherein the base has a thickness of at least one millimeter.

7. The cooling system of claim 1, wherein a distance between the heat spreader and the heat-generating structure is not more than one hundred micrometers.

8. The cooling system of claim 1, wherein the base includes an insulating layer, wherein the insulating layer electrically insulates the heat spreader from the substrate.

9. The cooling system of claim 8, wherein the insulating layer has a location selected from a bottom of the base and an interlayer within the base.

10. The cooling system of claim 1, wherein the base has a bottom, a portion of the bottom of the base being conductive.

11. The cooling system of claim 1, wherein the heat spreader has an area and the base has an outer perimeter, and wherein not more than ten percent of the area of the heat spreader overhangs the outer perimeter of the base.

12. A system, comprising:
a heat spreader in thermal communication with a heat-generating structure mounted on a substrate, the heat spreader over hanging the heat-generating structure and having a heat spreader thickness not exceeding six hundred micrometers;
an active cooling system including a plurality of active cooling cells, each of the plurality of active cooling cells including an active cooling element, the active cooling system being in thermal communication with the heat spreader, wherein the active cooling element undergoes vibrational motion when actuated to drive a fluid toward the heat spreader, a combined thickness of the heat spreader and the active cooling system not exceeding four millimeters; and
a base supporting the heat spreader and transferring a load from the heat spreader to the substrate such that a bending of the heat spreader does not exceed ten degrees;
wherein the base has an aperture therein, the aperture being aligned with the heat-generating structure such that the base is not interposed between the heat spreader and the heat-generating structure.

13. The system of claim 12, wherein the heat spreader has a thickness of not more than five hundred micrometers.

14. The system of claim 12, wherein the base has a thickness of at least one millimeter.

15. The system of claim 12, wherein the heat spreader is a distance of not more than one hundred micrometers from the heat-generating structure.

16. A method, comprising:
driving a cooling element to induce a vibrational motion at a frequency, the cooling element being in a cooling system, the cooling system also including a top plate and an orifice plate, the top plate including at least one vent therein corresponding to the cooling element, the orifice plate including at least one orifice corresponding to the cooling element, the cooling element being between the top plate and the orifice plate, the vibrational motion driving a fluid in through the at least one vent in the top plate and out through the at least one orifice in the orifice plate, toward a heat spreader in thermal communication with a heat-generating structure mounted on a substrate, the heat spreader over hanging the heat-generating structure; and
wherein a base supports the heat spreader and transfers a load from the heat spreader to the substrate such that a bending of the heat spreader does not exceed ten degrees;
wherein the base has an aperture therein, the aperture being aligned with the heat-generating structure such that the base is not interposed between the heat spreader and the heat-generating structure;
wherein the cooling system and the heat spreader have a combined thickness of not more than three millimeters.

17. The method of claim 16, wherein the frequency corresponds to a structural resonant frequency of the cooling element and an acoustic resonant frequency for the cooling element.

\* \* \* \* \*

UNITED STATES PATENT AND TRADEMARK OFFICE
CERTIFICATE OF CORRECTION

| | | |
|---|---|---|
| PATENT NO. | : 11,692,776 B2 | Page 1 of 1 |
| APPLICATION NO. | : 17/683020 | |
| DATED | : July 4, 2023 | |
| INVENTOR(S) | : Prabhu Sathyamurthy et al. | |

It is certified that error appears in the above-identified patent and that said Letters Patent is hereby corrected as shown below:

In the Specification

In Column 5, Line(s) 28, delete "hand held", and insert --handheld--, therefor.

Signed and Sealed this
Twenty-first Day of November, 2023

Katherine Kelly Vidal
*Director of the United States Patent and Trademark Office*